United States Patent
Hanari

(10) Patent No.: US 10,706,773 B2
(45) Date of Patent: Jul. 7, 2020

(54) DISPLAY DEVICE

(71) Applicant: Japan Display Inc., Minato-ku (JP)

(72) Inventor: Jun Hanari, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/854,060

(22) Filed: Dec. 26, 2017

(65) Prior Publication Data

US 2018/0182291 A1   Jun. 28, 2018

(30) Foreign Application Priority Data

Dec. 28, 2016 (JP) ................. 2016-256856

(51) Int. Cl.
```
G09G 3/3233    (2016.01)
H01L 51/56     (2006.01)
H01L 51/50     (2006.01)
G06F 3/045     (2006.01)
G09G 3/3216    (2016.01)
H01L 27/32     (2006.01)
```

(52) U.S. Cl.
CPC ........... *G09G 3/3233* (2013.01); *G06F 3/045* (2013.01); *G09G 3/3216* (2013.01); *H01L 27/3258* (2013.01); *H01L 27/3276* (2013.01); *H01L 27/3288* (2013.01); *H01L 51/5064* (2013.01); *H01L 51/56* (2013.01)

(58) Field of Classification Search
CPC .... G09G 3/3233; G09G 3/045; G09G 3/3216; H01L 27/3258; H01L 27/3276; H01L 27/3288; H01L 51/5064
See application file for complete search history.

(56) References Cited

U.S. PATENT DOCUMENTS

| 2008/0170055 A1* | 7/2008 | Kim ................ G09G 3/20 345/205 |
| 2014/0012130 A1* | 1/2014 | Jacobsen ............ A61B 5/065 600/424 |
| 2015/0187279 A1* | 7/2015 | Lee ................ G09G 3/3225 257/40 |

(Continued)

FOREIGN PATENT DOCUMENTS

JP    2016-76146    5/2016

*Primary Examiner* — Kent W Chang
*Assistant Examiner* — Sujit Shah
(74) *Attorney, Agent, or Firm* — Oblon, McClelland, Maier & Neustadt, L.L.P.

(57) ABSTRACT

A display device includes a display area including a pixel array part, a connection area including a connection terminal part and a bending area including first and second connection lines disposed between the pixel array part and the connection terminal part. Each of the first connection line and the second connection line includes a first layer wiring on a first layer and a second layer wiring on a second layer different from the first layer, the first layer wiring being disposed obliquely and rightward to an extending direction of the first connection line and the second connection line, the second layer wiring being disposed obliquely and leftward to the extending direction and connected to the first layer wiring. The first layer wiring of the first connection line and the second layer wiring of the second connection line are disposed to intersect each other.

7 Claims, 18 Drawing Sheets

(56) References Cited

U.S. PATENT DOCUMENTS

| | | | |
|---|---|---|---|
| 2015/0208522 A1* | 7/2015 | Kim | H05K 1/028 |
| | | | 361/749 |
| 2016/0035812 A1* | 2/2016 | Kwon | H01L 27/3276 |
| | | | 257/40 |
| 2016/0179229 A1* | 6/2016 | Ahn | G06F 3/041 |
| | | | 345/173 |
| 2016/0204366 A1* | 7/2016 | Zhang | H01L 23/4985 |
| | | | 257/40 |
| 2016/0242295 A1* | 8/2016 | Kim | H05K 1/189 |

* cited by examiner

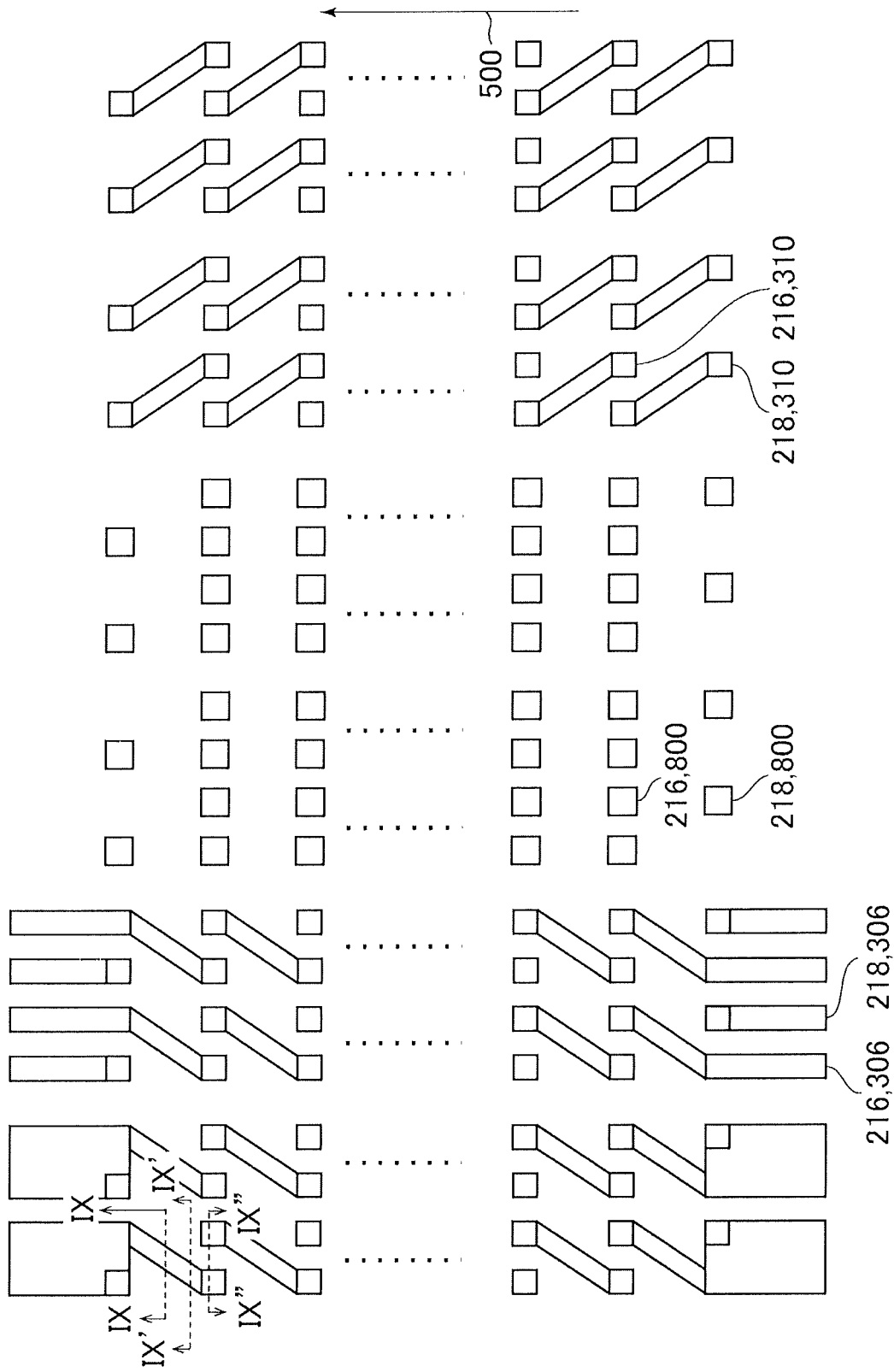

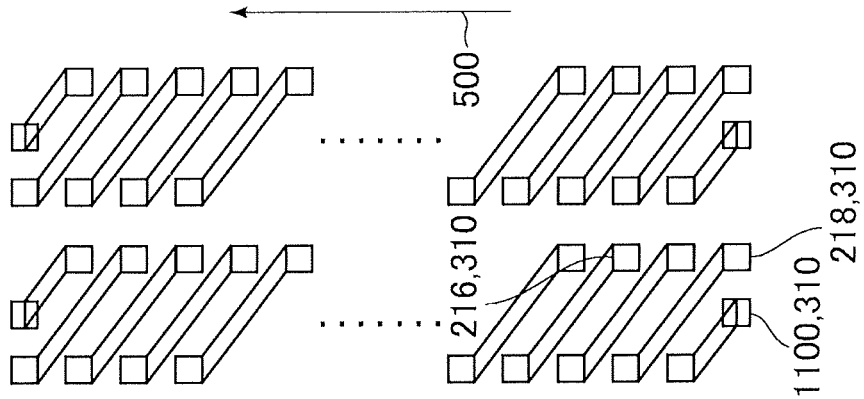
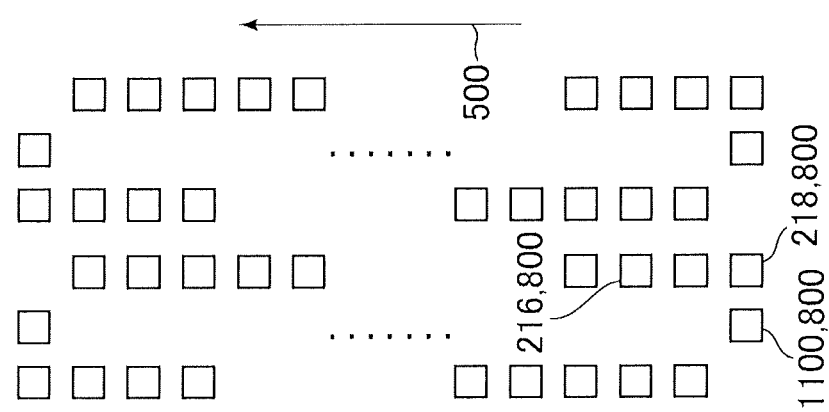
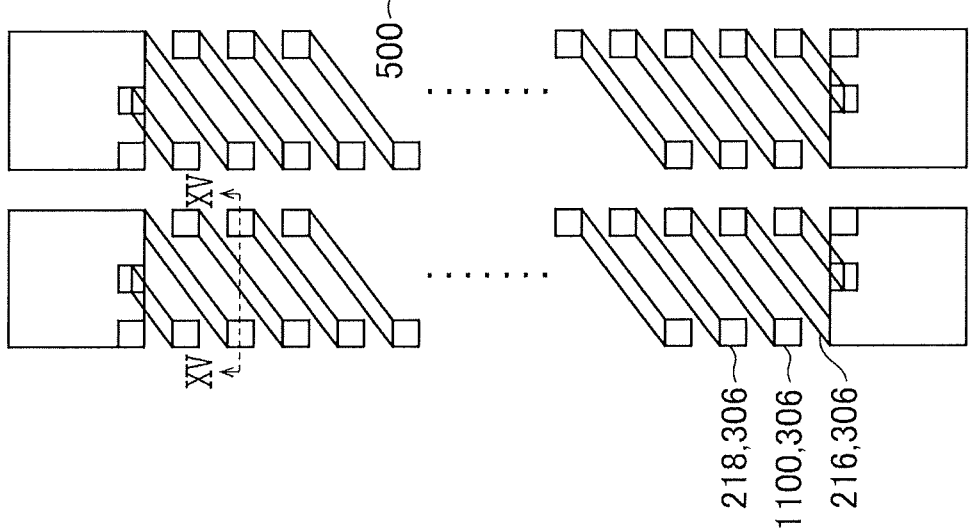

DISPLAY DEVICE

CROSS-REFERENCE TO RELATED APPLICATION

The present application claims priority from Japanese Application JP2016-256856 filed on Dec. 28, 2016, the content of which is hereby incorporated by reference into this application.

BACK GROUND OF THE INVENTION

1. Field of the Invention

The present invention relates to a display device.

2. Description of the Related Art

A flat panel display, such as an organic electroluminescence (EL) display device, includes a display panel having a thin film transistor and an organic light-emitting diode on a substrate, for example. A glass substrate has been used for a base material of a display panel. Recently work has been progressing on a flexible display in which a resin film, such as a polyimide film, is used for the base material so that a display panel can be bent.

The flexible display is used for the purpose of narrowing a frame area by bending an area outside of an image display area of a display panel, on which an integrated circuit and a flexible printed circuit are mounted, to the back side of the display area.

JP2016-76146A discloses improving flexibility of a touch panel sensor by arranging a lead-out wiring to be inclined to a bending line at a bending part of the touch panel sensor.

SUMMARY OF THE INVENTION

However, since diamond-shaped wiring is used in JP2016-76146A, a conductor formation area per unit area is small, and thus the resistance of the wiring arranged on the bending area cannot be reduced. In order to reduce the resistance of the wiring, a plurality of wires are needed, which results in increasing a size of an area where the wires are disposed.

One or more embodiments of the present invention have been conceived in view of the above, and an object thereof is to prevent a tearing of wires and to reduce an area to dispose a connection line by disposing the connection line obliquely to a bending direction of the substrate.

According to one aspect of the present invention, a display device includes a display area including a pixel array part having at least one terminal, a connection area disposed on a back side of the display area and including a connection terminal part to which a signal is supplied from outside and a bending area connecting the display area with the connection area and including a first connection line and a second connection line that are disposed between the pixel array part and the connection terminal part. Each of the first connection line and the second connection line includes a first layer wiring on a first layer and a second layer wiring on a second layer that is different from the first layer, the first layer wiring being disposed obliquely and rightward to an extending direction of the first connection line and the second connection line, the second layer wiring being disposed obliquely and leftward to the extending direction and connected to the first layer wiring. The first layer wiring of the first connection line and the second layer wiring of the second connection line are disposed so as to intersect each other.

In one embodiment of the present invention, the display device further includes a third connection line on the bending area, the third connection line electrically connecting the pixel array part with the connection terminal part. The third connection line includes the first layer wiring and the second layer wiring. The first layer wiring of the third connection line is disposed between the first layer wiring of the first connection line and the first layer wiring of the second connection line, and intersects with the second layer wiring of the first connection line and the second layer wiring of the second connection line. The second layer wiring of the third connection line is disposed between the second layer wiring of the first connection line and the second layer wiring of the second connection line, and intersects with the first layer wiring of the first connection line and the first layer wiring of the second connection line.

In one embodiment of the present invention, the first connection line and the second connection line are electrically connected to each other in the frame area disposed around the display area and in the connection area.

In one embodiment of the present invention, the first to third connection lines are electrically connected to one another in the frame area disposed around the display area and in the connection area.

In one embodiment of the present invention, the display device further includes an insulating layer between the first layer and the second layer in the bending area, the insulating layer electrically insulating the first layer wiring from the second layer wiring.

In one embodiment of the present invention, the first connection line receives one side of a differential signal, and the second connection line receives the other side of the differential signal.

In one embodiment of the present invention, GND voltage is supplied to the third connection line.

In one embodiment of the present invention, each of the first connection line and the second connection line includes third layer wiring between the first layer and the second layer in an area where the first layer wiring of the first connection line overlaps with the second layer wiring of the first connection line and in an area where the first layer wiring of the second connection line overlaps with the second layer wiring of the second connection line, the third layer wiring electrically connecting the first layer wiring with the second layer wiring.

BRIEF DESCRIPTION OF THE DRAWINGS

FIGS. 9A to 9C are plan views of the first connection lines and the second connection lines in the second embodiment;

FIGS. 15A to 15C are plan views of first to third connection lines in the fourth embodiment;

DETAILED DESCRIPTION OF THE INVENTION

An embodiment of the present invention will be described below in detail with reference to the accompanying drawings. The accompanying drawings schematically illustrate widths, thicknesses, shapes, or other characteristics of each part for clarity of illustration, compared to actual configurations. However, such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

In the embodiment below, an organic EL display device is given as an example, although examples of other applications include any of flat panel display devices, such as liquid crystal display devices, other self-emitting display devices, and electronic paper display devices having an electrophoresis element. Needless to say, the present invention can be applied to any of small-sized to large-sized display devices without being limited particularly.

First Embodiment

Figure 1:
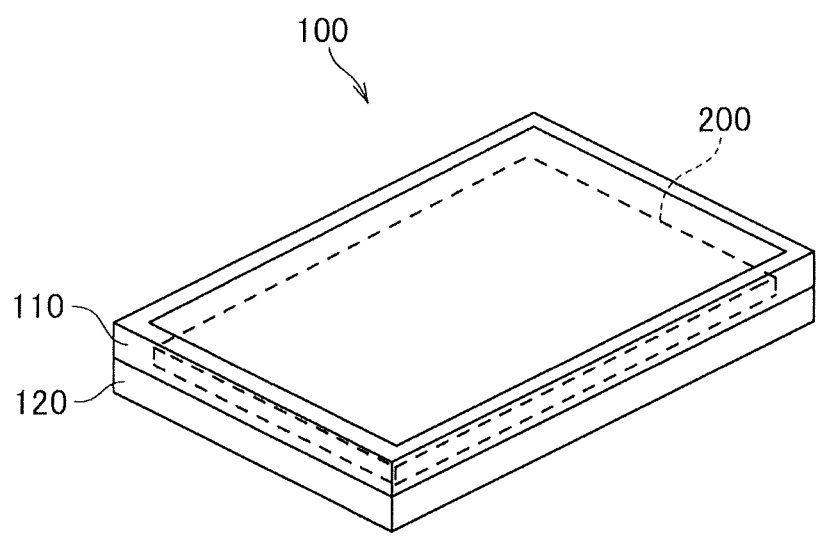
FIG. 1 is a schematic diagram of an organic EL display device according to an embodiment of the present invention.

FIG. 1 is a schematic diagram of an organic EL display device 100 according to an embodiment of the present invention. As shown in FIG. 1, the organic EL display device 100 includes an organic EL panel 200 fixed between an upper frame 110 and a lower frame 120.

Figure 2:
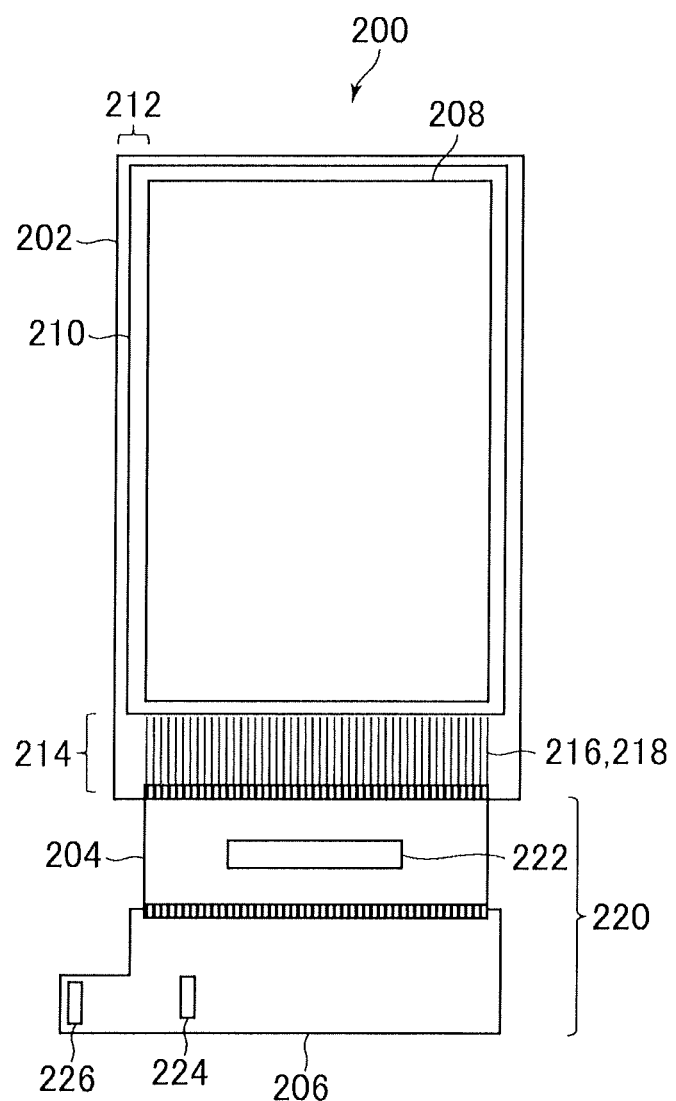
FIG. 2 is a diagram illustrating a configuration viewed from a display area of the organic EL panel.

FIG. 2 is a schematic diagram illustrating a configuration of the organic EL panel 200 in FIG. 1. As shown in FIG. 2, the organic EL panel 200 includes an insulating substrate 202, a first wiring substrate 204, and a second wiring substrate 206.

The insulating substrate 202, the first wiring substrate 204, and the second wiring substrate 206 are substrates made of resin, and formed of, for example, polyimide having a thickness of 10 to 20 μm. The insulating substrate 202 includes a display area 208, a frame area 212, and a bending area 214.

The display area 208 has a pixel array part including at least one terminal. Specifically, the display area 208 includes the pixel array part, on which pixels respectively emitting light are disposed in a matrix, on an inorganic film 210 serving as a foundation layer. The pixel array part includes a terminal to supply each pixel with power and signals for lighting. Each pixel includes transistors 302, which will be described later, and a capacitor. The terminal included in the pixel array part is a terminal to which scanning signals, video signals, and power are supplied from a driving semiconductor 222 through a first connection line and a second connection line.

The frame area 212 is disposed around the display area 208. Specifically, the inorganic film 210 is disposed in the frame area 212 so as to surround the display area 208. In the right and left frames, for example, a circuit for generating a signal to select a row of the pixel array part is disposed on the upper layer of the inorganic film 210. In the upper and lower frames, wiring for extending power and wiring for distributing data signals are disposed, for example.

The bending area 214 connects the display area 208 to the connection area 220. The bending area 214 includes first connection lines 216 and second connection lines 218 that disposed between the pixel array part and the connection terminal part 226. The first connection lines 216 and the second connection lines 218 will be described in detail later.

The first wiring substrate 204 and the second wiring substrate 206 include the connection area 220. The connection area 220 is disposed on the back side of the display area 208, and includes a connection terminal part 226 to which signals are supplied from outside. Specifically, the connection area 220 is an area on which the connection terminal part 226 for supplying signals from the outside of the organic EL panel 200 is disposed. The connection area 220 is disposed on the first wiring substrate 204 and/or on the second wiring substrate 206, and thus disposed on the back side of the display area 208.

The first wiring substrate 204 is connected to the insulating substrate 202, and provided with the driving semiconductor 222. The driving semiconductor 222 supplies data signals and supply voltage from the second wiring substrate 206 to the pixels through the first connection lines 216 and the second connection lines 218. The pixels emit light by the power and the data signal, and an image is displayed on the display area 208.

The second wiring substrate 206 is connected to the first wiring substrate 204, and includes a connection terminal part 226 and a circuit component 224. The connection terminal part 226 is a connector for external connection, for example, and connected to an external device supplying power and data signals to the organic EL panel 200. The connection terminal part 226 supplies the power and the data signals to an electron circuit (not shown) formed of the circuit component 224. The power and the data signals generated by the electron circuit are supplied to the pixel array part through the driving semiconductor 222 or the first connection lines 216 and the second connection lines 218.

Figure 3:
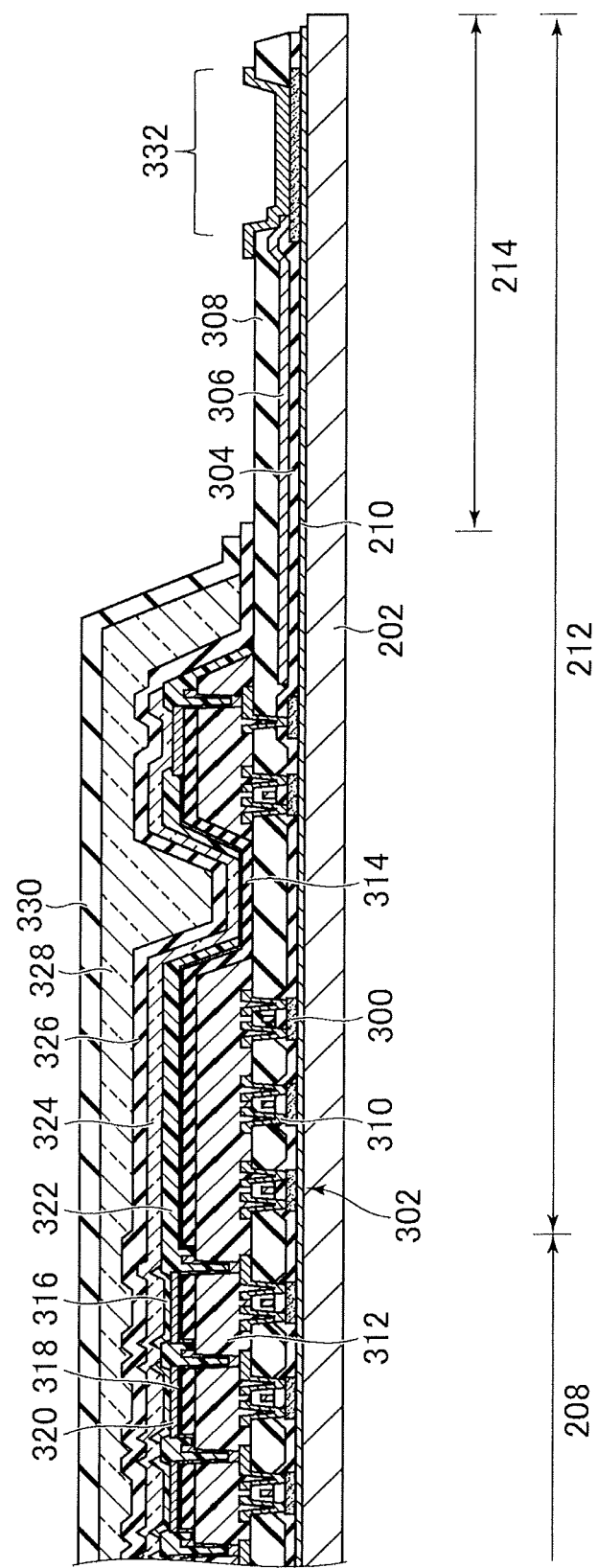
FIG. 3 is a cross-sectional view of the organic EL panel.

Next, the cross section of the organic EL panel 200 before it is bent will be described. FIG. 3 is a cross-sectional view of the display area and the bending area in FIG. 2. The cross-sectional view of the organic EL panel 200 that is bent (see FIG. 5) described later shows that the organic EL panel 200 includes a spacer and reinforcing film, for example, although the spacer and the reinforcing film are omitted in FIG. 3.

The insulating substrate 202 is a flexible film made of polyimide or polyethylene terephthalate, for example. The inorganic film 210, which serves as a barrier to impurities included in the insulating substrate 202, is disposed on the surface of the insulating substrate 202. The inorganic film 210 is an underlying insulating layer. The inorganic film 210 is formed of three or five layers of nitride films and oxide films laminated alternately. The nitride film has a thickness of 20 to 50 nm. The oxide film has a thickness of 100 to 500 nm.

The semiconductor layer 300 is laminated on the inorganic film 210. Channel regions, source regions, and drain regions of a transistor 302 of the pixel circuit and a transistor 302 of a peripheral circuit are formed with the semiconductor layer 300. The semiconductor layer 300 is a p-Si layer formed by performing excimer laser annealing (ELA) processing on an a-Si layer. The semiconductor layer 300 has a thickness of 50 nm, for example.

The gate insulating film 304 formed of silicone oxide, for example, is disposed on the semiconductor layer 300. The gate insulating film 304 is formed of, for example, Si(OC2H5)4 in a thickness of 80 to 100 nm.

A first wiring layer 306 is disposed on the gate insulating film 304. The first wiring layer 306 is formed of MoW. The first wiring layer 306 may be formed by laminating Ti of 100 to 200 nm thickness, TiAl of 100 to 300 nm thickness, and Ti of 100 to 200 nm thickness. The first wiring layer 306 is used as a gate electrode of the transistor 302 in the pixel array part.

A first inorganic insulating film 308 is disposed as an insulating interlayer so as to cover the first wiring layer 306. The first inorganic insulating film 308 is formed by laminating, for example, a nitride film of 300 nm thickness and an oxide film of 300 to 400 nm thickness.

A second wiring layer 310 is disposed on the first inorganic insulating film 308. The second wiring layer 310 is formed by, for example, laminating Mo of 100 to 200 nm thickness, AlNd of 300 to 600 nm thickness, and Mo of 30 to 100 nm thickness. The second wiring layer 310 may be formed by laminating Ti, Al, and Ti. The second wiring layer 310 electrically connects a lower electrode 320 and a reflective film 318 to the semiconductor layer 300 of the transistor 302 through a contact hole penetrating the gate insulating film 304 and the inorganic film 210.

The first wiring layer 306 and the second wiring layer 310 are also disposed on the bending area 214 described above. The first wiring layer 306 and the second wiring layer 310 disposed on the bending area 214 are a part of the first connection lines 216 and the second connection lines 218.

An organic flattening film 312 made of an organic material is disposed so as to cover the second wiring layer 310. The organic flattening film 312 is formed of polyimide or acrylic resin, for example, in thickness of 2 to 3 µm. The organic flattening film 312 flattens steps in the layers below the organic flattening film 312.

A second inorganic insulating film 314 is disposed on the surface of the organic flattening film 312 in order to prevent moisture ingress from the organic flattening film 312, for example, to the organic EL film 316. The second inorganic insulating film 314 is formed of a material having moisture resistance and insulation properties. For example, the second inorganic insulating film 314 is formed by laminating a nitride film and an oxide film. The second inorganic insulating film 314 may be formed of a nitride film in a thickness of 200 nm.

The reflective film 318 and the lower electrode 320 are disposed on the second inorganic insulating film 314. The reflective film 318 is formed of, for example, a material reflecting light, such as MgAg. The lower electrode 320 is electrically connected to the source electrode of the transistor 302 through a contact hole penetrating the second inorganic insulating film 314 and the organic flattening film 312. Specifically, for example, the lower electrode 320 is formed by laminating indium tin oxide of 30 to 60 nm thickness, silver of 100 to 150 nm thickness, and indium tin oxide of 10 to 20 nm thickness. Iridium zinc oxide may be used instead of indium tin oxide. The lower electrode 320 corresponds to an anode of an organic EL element disposed in each pixel.

An organic bank 322 is disposed on the reflective film 318 and the lower electrode 320. The organic bank 322 is disposed along the boundary of the pixel, and has an opening at the light emitting surface of the organic EL film 316. The organic EL film 316 including a light-emitting layer is disposed at the bottom of the opening. The organic bank 322 is formed of, for example, polyimide or acrylic resin in thickness of 1 to 2 µm.

The organic EL film 316 includes, for example, a hole injection layer, a hole transport layer, a light-emitting layer, an electron injection layer, an electron transport layer. A light-emitting layer is formed for each pixel using materials respectively emitting red, green, and blue light.

An upper electrode 324 is disposed on the organic EL film 316. The upper electrode 324 is disposed across the display area 208 and the frame area 212. The upper electrode 324 is a common electrode for all the pixels in the entire pixel array part. The upper electrode 324 is formed of a material that transmits light emitted from the organic EL film 316. For example, the upper electrode 324 is formed of a transparent conductive material, such as indium zinc oxide and indium tin oxide. The upper electrode 324 is electrically connected to the lower electrode 320 formed on the frame area 212 through the contact hole. The upper electrode 324 corresponds to a cathode of an organic EL element disposed in each pixel.

A sealing film is disposed on the entire display area 208, on which the organic EL element including the lower electrode 320, the organic EL film 316, and the upper electrode 324 are disposed, so as to seal the upper surface of the organic EL film 316 to prevent deterioration of the organic EL film 316 due to moisture. The sealing film is formed by laminating a first inorganic sealing film 326, an organic sealing film 328, and a second inorganic sealing film 330. For example, the sealing film is formed by laminating a nitride film of 1 to 10 µm thickness, a resin layer of 5 to 50 µm thickness, and a nitride film of 1 to 10 µm thickness.

The display panel has an external contact part 332 where the second wiring layer 310 is exposed on the right edge of FIG. 3. In the external contact part 332, the second wiring layer 310 is electrically connected to the terminal disposed on the first wiring substrate 204.

Figure 4:
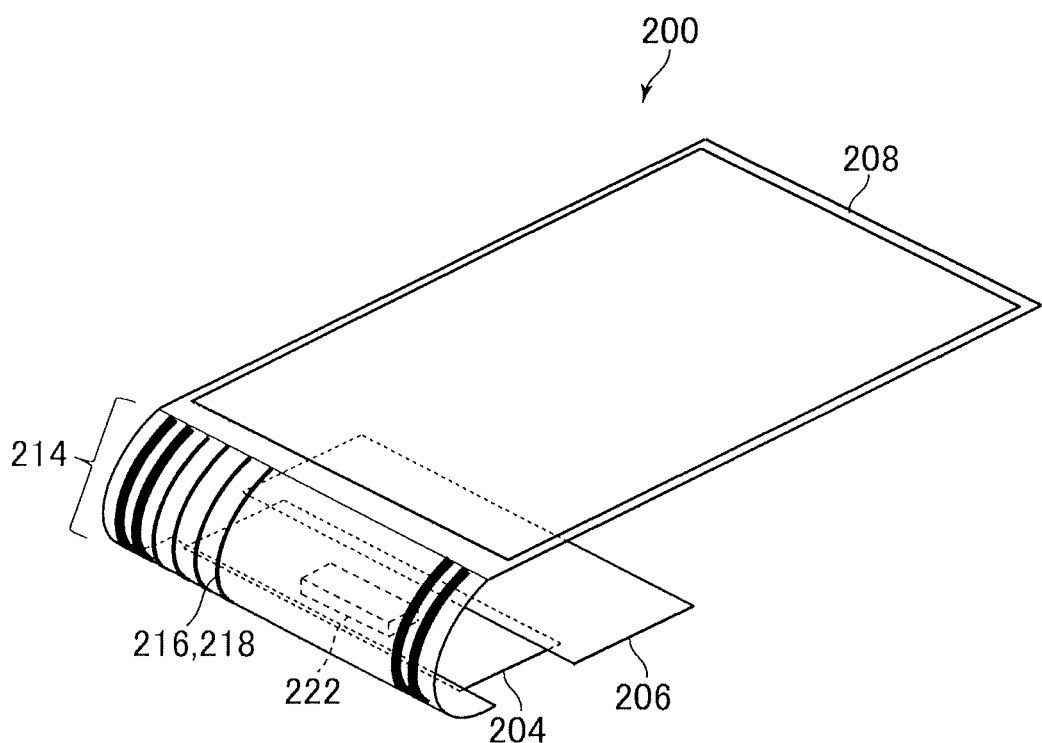
FIG. 4 is a diagram illustrating the organic EL panel being bent.

Next, the organic EL panel 200 after being bent will be described. The organic EL panel 200 is bent after the external contact part 332 is connected to the first wiring substrate 204. FIG. 4 is a perspective view of the organic EL panel 200 being bent. With the bending area 214 being bent, the first wiring substrate 204 and the second wiring substrate 206 are disposed on the back side of the display area 208.

When being bent, the first connection line 216 and the second connection line 218 are applied with stress.

Figure 5:
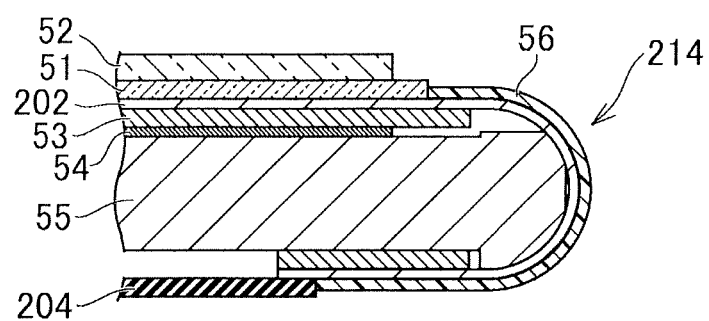
FIG. 5 is a cross-sectional view of the organic EL panel being bent.

FIG. 5 is a schematic sectional view of the organic EL panel 200 near the bending area 214. As shown in FIG. 5, the organic EL panel 200 includes an insulating substrate 202, a protective film 51, a polarizing plate 52, a first reinforcing film 53, a heat spreading sheet 54, a spacer 55, and a second reinforcing film 56.

The insulating substrate 202 is bent at the bending area 214. FIG. 3 shows that the organic EL panel 200 includes from the inorganic film 210 to the second inorganic sealing film 330, although films including from the inorganic film to the second inorganic sealing film 330 are omitted here.

The protective film 51 is a film for protecting the organic EL panel 200. Specifically, the protective film 51 is a film for protecting the surface of the second inorganic sealing film disposed on the insulating substrate 202.

The polarizing plate 52 reduces reflection of external light incident to the organic EL panel 200. The polarizing plate 52 improves visibility of the organic EL display device 100.

The first reinforcing film 53 is a film for reinforcing the organic EL panel 200. The first reinforcing film 53 is disposed on a flat area of the organic EL panel 200 being bent. Specifically, the first reinforcing film 53 is disposed on the back side of the display area 208 of the organic EL panel 200.

The heat spreading sheet 54 is a sheet for spreading heat of the organic EL panel 200. Specifically, the heat spreading sheet 54 spreads heat, which is generated in the drive circuits disposed around the organic EL panel 200, over the entire organic EL panel 200. The heat spreading sheet 54 can prevent a situation in which only a portion of the organic EL panel 200 becomes hot.

The spacer 55 is disposed between the surface side and the back side of the bent organic EL panel 200. The spacer 55 keeps a predetermined or larger space between the surface side and the back side of the organic EL panel 200. The spacer 55 can maintain the curvature of the bending area 214 within the allowable range even if the stress in the thickness direction is applied to the organic EL panel 200.

The edge of the spacer 55 is formed to be a curved surface having the curvature according to the backside of the bending area 214. The edge of the spacer 55 is brought into contact with the back side of the bending area 214 so that the shape of the bending area 214 is maintained even if the stress is applied to the surface of the bending area 214. The spacer 55 serves to reduce the stress applied to the first connection lines and the second connection lines disposed on the bending area 214, and thus renders a break in the first connection lines and the second connection lines less likely.

The second reinforcing film 56 is a film for reinforcing the organic EL panel 200. The second reinforcing film 56 is disposed on the bending area 214 of the bent organic EL panel 200. The second reinforcing film 56 is formed of a material and a thickness that are more bendable than those of the first reinforcing film 53.

The second reinforcing film 56 may not be attached to the bending area 214. With this configuration, the bending area 214 is more flexible, and thus the organic EL panel 200 can be curved with a smaller radius of curvature. When the radius of curvature of the bending area 214 is smaller, the size of the bent organic EL panel 200 is smaller in a plan view, and the thickness of the bent organic EL panel 200 is also smaller.

As described above, the first wiring substrate 204 and the second wiring substrate 206 succeeding to the bending area 214 viewed from the display area 208 can be folded back to the back side of the display area 208. The organic EL panel 200 thus folded back can reduce the size of the organic EL panel 200 in a plan view, which helps to downsize the organic EL display device 100 including the organic EL panel 200. Further, the portion succeeding to the bending area 214 of the insulating substrate 202 of the organic EL panel 200 is concealed behind the display area 208, and thus the ratio of the display area 208 in the front side of the organic EL display device 100 can be increased.

In addition, for example, the driving semiconductor 222 is mounted on the folded-back portion of the organic EL panel 200, and the frame area 212 that appears on the display surface side is not used as an area to dispose components such as an IC. This configuration helps to reduce the size of the frame area 212. In other words, so-called narrowing of the frame of the organic EL display device 100 can be progressed.

Next, the first connection lines 216 and the second connection lines 218 will be described. In the following, if not otherwise stated, the bending area before being bent will be described.

Figure 6:
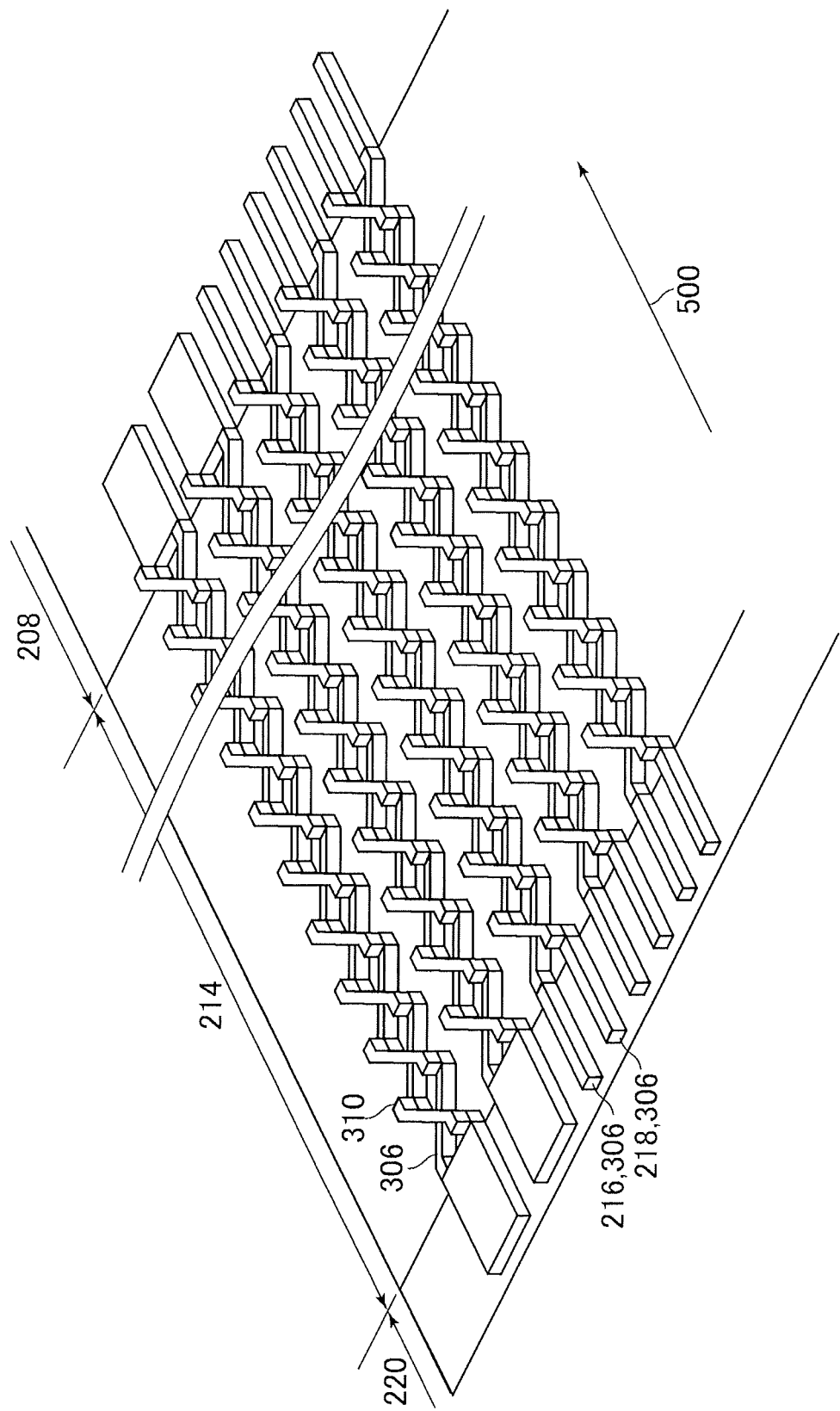
FIG. 6 is a perspective view of first connection lines and second connection lines in the first embodiment.
Figures 7A, 7B:
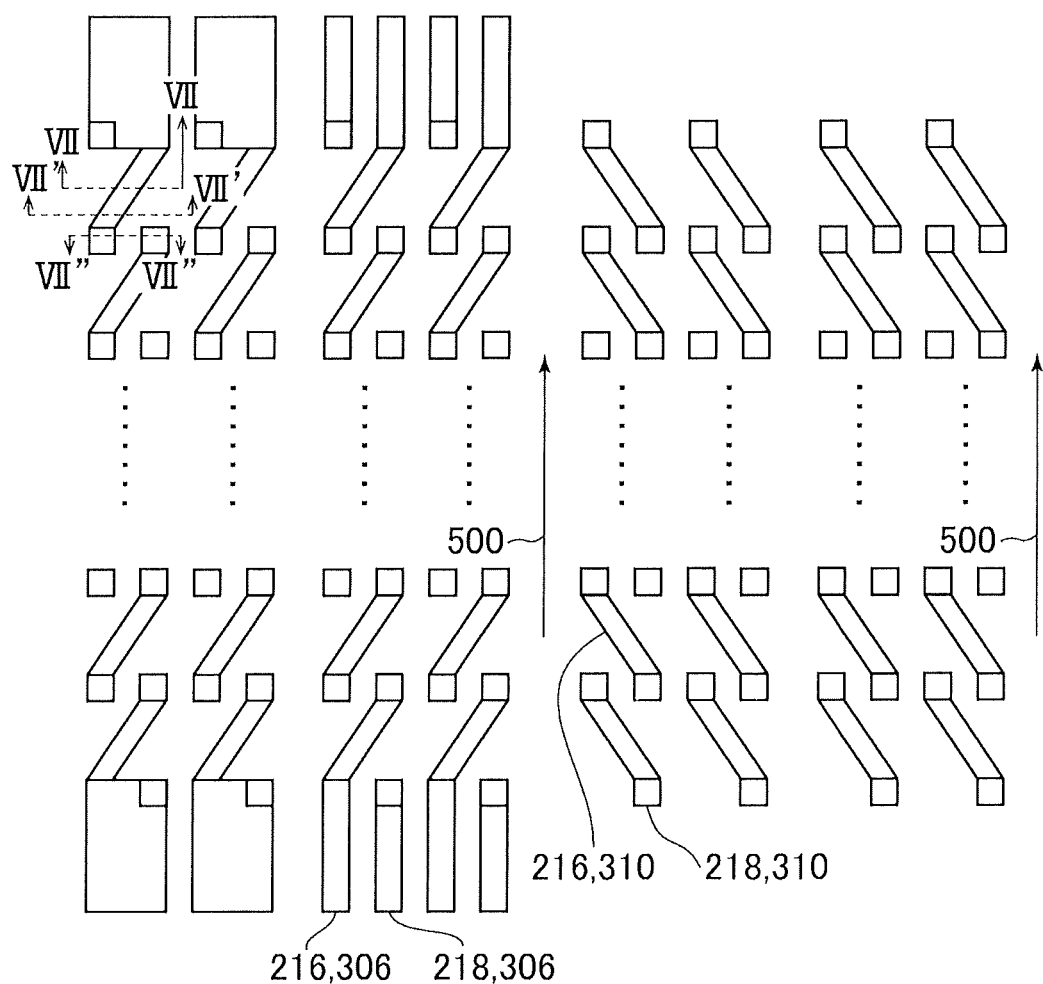
FIGS. 7A and 7B are plan views of the first connection lines and the second connection lines in the first embodiment.

FIG. 6 is a perspective view of the first connection lines 216 and the second connection lines 218 in the first embodiment. One of the first connection lines 216 and one of the second connection lines 218 are combined together in wiring. In FIG. 6, five pairs of first connection lines 216 and second connection lines 218 are illustrated. FIG. 7A is a plan view of first layer wiring disposed in the bending area 214 in the first embodiment. FIG. 7B is a plan view of second layer wiring disposed in the bending area 214 in the first embodiment. FIGS. 7A and 7B illustrate four pairs of first connection lines 216 and second connection lines 218.

As shown in FIG. 6, the first connection lines 216 and the second connection lines 218 are disposed on the bending area 214 between the connection area 220 and the display area 208.

The first connection lines 216 and the second connection lines 218 respectively have first layer wiring disposed obliquely and rightward to an extending direction 500 on the first layer. The extending direction 500 is a direction extending from the connection area 220 of the first connection lines 216 and the second connection lines 218 to the pixel array part of the display area 208.

The first connection lines 216 and the second connection lines 218 respectively have second layer wiring disposed obliquely and leftward to the extending direction 500 on a second layer, which is different from the first layer, and connected to the first layer wiring. The extending direction 500 may be a direction extending from the display area 208 to the connection area 220 of the first connection lines 216 and the second connection lines 218.

Specifically, as shown in FIG. 7A, the first layer wiring of the first connection line 216 is disposed obliquely and rightward to the extending direction 500 on an area (lower area in FIG. 7A) closest to the connection area 220 in the bending area 214. The first layer wiring of the second connection line 218 and the first layer wiring of the first connection line 216 are alternately disposed from the first layer wiring of the first connection line 216 to the extending direction 500.

As shown in FIG. 7B, the second layer wiring of the second connection lines 218 is disposed obliquely and leftward to the extending direction 500 on an area closest to the connection area 220 in the bending area 214. The second layer wiring of the first connection lines 216 and the second layer wiring of the second connection line 218 are alternately disposed from the second layer wiring of the second connection line 218 to the extending direction 500.

The first layer wiring shown in FIG. 7A and the second layer wiring shown in FIG. 7B are planarly overlapped with each other, and thus the first layer wiring of the first connection lines 216 and the second layer wiring of the second connection lines 218 are disposed to be intersected with each other. Further, the second layer wiring of the first connection lines 216 and the first layer wiring of the second connection lines 218 are disposed to be intersected with each other.

The first connection lines 216 are lines that electrically connect the pixel array part to the connection terminal part 226. As such, the first layer wiring and the second layer wiring of the first connection lines 216 are electrically connected to each other. The first layer wiring and the second layer wiring of the second connection lines 218 are also electrically connected to each other.

The connection lines 216 and the second connection lines 218 are insulated by an insulating layer disposed between the first layer wiring and the second layer wiring to electrically insulate the first layer wiring from the second layer wiring. Such relationship between the first connection lines 216 and the second connection lines 218 will be described referring to FIGS. 8A to 8F illustrating sectional views of the first connection lines 216 and the second connection lines 218.

Figure 8A:
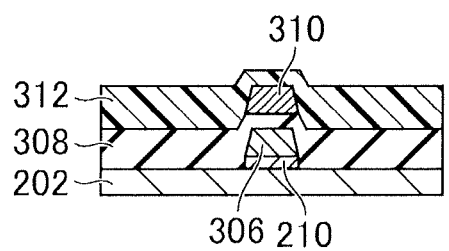
FIGS. 8A to 8F are cross-sectional views of the first connection lines and the second connection lines in the first embodiment.
Figure 8D:
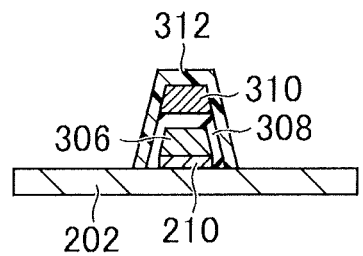
Figure 8B:
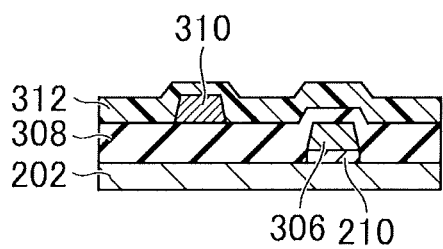
Figure 8E:
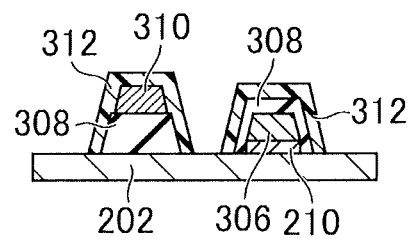
Figure 8C:
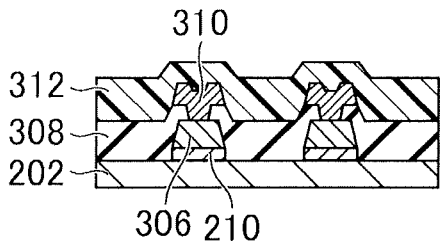
Figure 8F:
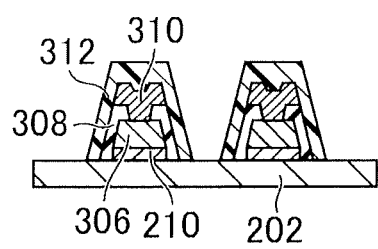

FIGS. 8A and 8D are cross-sectional views of the first connection lines 216 and the second connection lines 218 taken along the line VII-VII in FIG. 7A at the position where the first connection lines 216 and the second connection lines 218 are planarly overlapped from each other. FIGS. 8B and 8E are cross-sectional views of the first connection lines 216 and the second connection lines 218 taken along the line VII'-VII' in FIG. 7A at the position where the first connection lines 216 and the second connection lines 218 are planarly shifted from each other. FIGS. 8C and 8F are cross-sectional views of the first connection lines 216 and the second connection lines 218 taken along the line VII"-VII" in FIG. 7A at the position where the first layer wiring and the second layer wiring are electrically connected to each other.

As shown in FIG. 8A, the inorganic film 210 having the same width as that of the first connection line 216 or the second connection line 218 and the first layer wiring (described as first wiring layer 306 in FIG. 8A, the same applies to the following) are disposed on the insulating substrate 202. The first layer wiring may be the first layer wiring of the first connection lines 216 or the first layer wiring of the second connection lines 218. The first inorganic insulating film 308 is disposed so as to cover the inorganic film 210 and the first layer wiring. The second layer wiring (described as second wiring layer 310 in FIG. 8A, the same applies to the following) is disposed at the position to planarly overlap with the first layer wiring. The second layer wiring is wiring of the first connection lines 216 or the second connection lines 218, and included in the lines different from the lines disposed in the first layer wiring. The organic flattening film 312 is disposed to cover the second layer wiring.

As described above, the first inorganic insulating film 308 is disposed between the first connection lines 216 and the second connection lines 218 at the position where the first connection lines 216 and the second connection line 218 are planarly overlapped with each other. This electrically insulates the first connection lines 216 from the second connection lines 218 in the bending area 214. As shown in a variation in FIG. 8D, the first inorganic insulating film 308 and the organic flattening film 312 may be disposed only around the first connection lines 216 and the second connection lines 218.

The cross-sectional configuration of the first connection lines 216 and the second connection lines 218 at the position where the first connection lines 216 and the second connection lines 218 are planarly shifted from each other is the same as the cross-sectional configuration shown in FIG. 8A except that the first layer wiring and the second layer wiring are planarly shifted from each other as shown in FIG. 8B. In the above described variation, as shown in FIG. 8E, the second layer wiring is disposed on the first inorganic insulating film 308, and the organic flattening film 312 is disposed so as to cover the second layer wiring and the first inorganic insulating film 308. The first layer wiring is disposed on the inorganic film 210, and the first inorganic insulating film 308 and the organic flattening film 312 are disposed so as to cover the first layer wiring and the inorganic film 210.

At the position where the first layer wiring and the second layer wiring are electrically connected to each other, the separated inorganic film 210 and first layer wiring are disposed in the right side and the left side of FIG. 8C. The first inorganic insulating film 308 includes a contact hole at the top of the first layer wiring, and is disposed so as to cover other areas. The second layer wiring is disposed to be connected to the first layer wiring through the contact hole. The organic flattening film 312 is disposed to cover the first inorganic insulating film 308 and the second layer wiring. In the above described variation, as shown in FIG. 8F, the first inorganic insulating film 308 and the organic flattening film 312 may be disposed only around the first connection line 216 and the second connection line 218.

As described above, the first connection lines 216 and the second connection lines 218 are configured with the first layer wiring and the second layer wiring, and thus an area to dispose each connection line can be reduced. This enables to improve density of connection line placement. Further, the first layer wiring and the second layer wiring are disposed obliquely to the extending direction 500. Such placement serves to prevent a tearing of the first connection lines 216 and the second connection lines 218 even if stress is applied to the first connection lines 216 and the second connection lines 218.

The first connection lines 216 and the second connection lines 218 may be provided with power or signals. In a case where power is supplied to the first connection lines 216 or the second connection lines 218, as shown in the two pairs of first and second connection lines 216 and 218 in the left of FIG. 6, the first connection lines 216 and the second connection lines 218 may be electrically connected to each other in the pixel array part and the connection area 220. It is possible to reduce electrical resistance by electrically connecting the first connection lines 216 to the second connection lines 218.

As shown in three pairs of first and second connection lines 216 and 218 in the right of FIG. 6, in a case where the first connection lines 216 and the second connection lines 218 are electrically insulated from each other, a first connection line 216 may receive one side of a differential signal, and a second connection line 218 combined with the first connection line 216 may receive the other side of the differential signal. Inputting a pair of differential signals can reduce radiation noise.

Second Embodiment

Next, the second embodiment in which the first connection lines 216 and the second connection lines 218 have third layer wiring 800 will be described. In the second embodiment, the matters that are not particularly described are similar to those in the first embodiment, and thus the detailed description will be omitted.

FIG. 9A is a plan view of the first layer wiring disposed in the bending area 214 according to the second embodiment. FIG. 9B is a plan view of the third layer wiring 800. FIG. 9C is a plan view of the second layer wiring. The first layer wiring shown in FIG. 9A and the second layer wiring shown in FIG. 9C are the same as those in the first embodiment.

As shown in FIG. 9B, in an area where the first layer wiring and the second layer wiring of the first connection lines 216 overlap with each other and an area where the first layer wiring and the second layer wiring of the second connection lines 218 overlap with each other, the first connection lines 216 and the second connection lines 218 have third layer wiring 800 between the first layer and the second layer so as to electrically connect the first layer wiring to the second layer wiring.

Figure 10A:
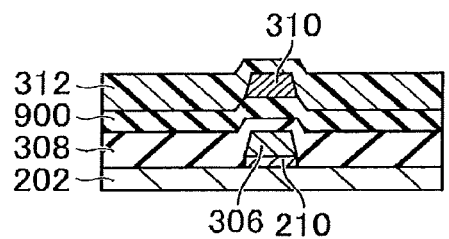
FIGS. 10A to 10F are cross-sectional views of the first connection lines and the second connection lines in the second embodiment.
Figure 10D:
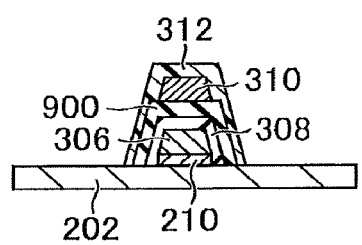
Figure 10B:
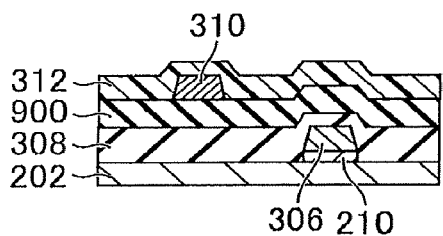
Figure 10E:
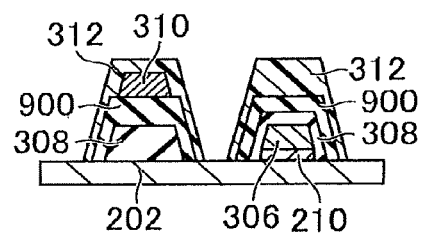
Figure 10C:
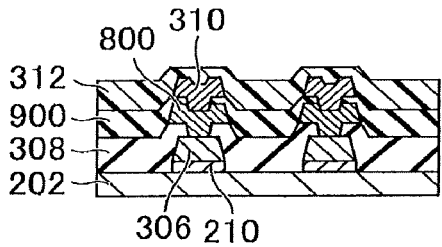
Figure 10F:
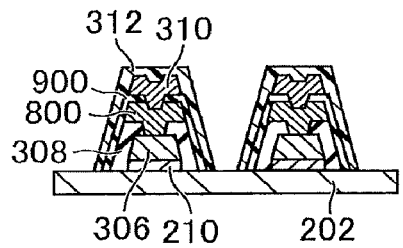
Figure 11A:
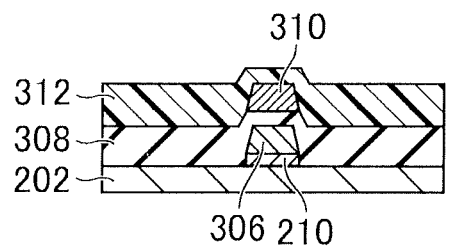
FIGS. 11A to 11F are cross-sectional views of the first connection lines and the second connection lines in a variation of the second embodiment.
Figure 11D:
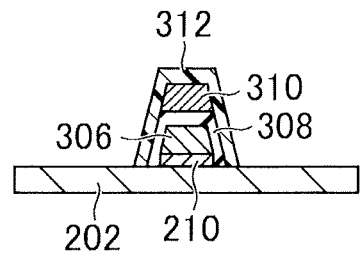
Figure 11B:
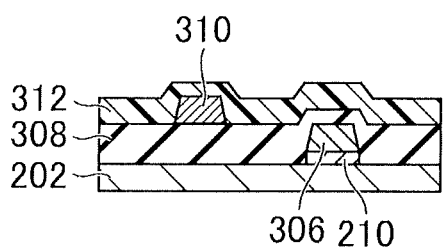
Figure 11E:
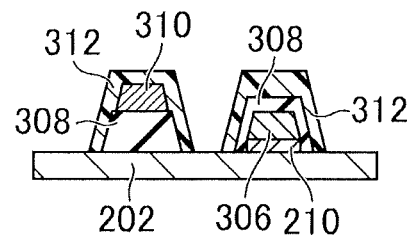
Figure 11C:
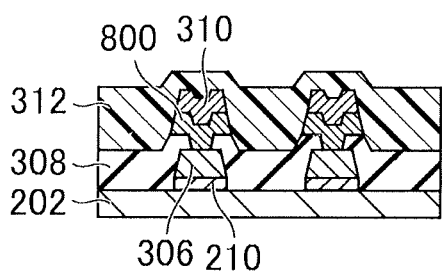
Figure 11F:
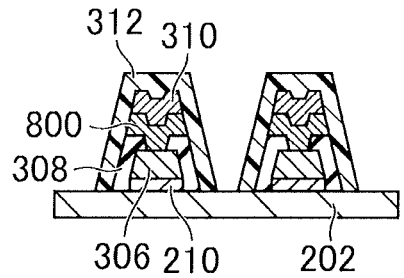

FIGS. 10A and 10D are IX-IX cross sections of FIG. 9A at the position where the first connection lines 216 planarly overlap with the second connection line 218. FIGS. 10B and 10E are IX'-IX' cross sections of FIG. 9A at the position where the first connection lines 216 and the second connection lines 218 are planarly shifted from each other. FIGS. 10C and 10F are IX"-IX" cross sections of FIG. 9A at the position where the first layer wiring and the second layer wiring are electrically connected to each other.

As shown in FIG. 10A, a third inorganic insulating film 900 is disposed between the first inorganic insulating film 308 and the second layer wiring. Although not shown in FIG. 3, the third inorganic insulating film 900 may be formed of the same material as that of the first inorganic insulating film 308 or the second inorganic insulating film 314. As shown in FIG. 10D, as a variation of the second embodiment, the first inorganic insulating film 308, the organic flattening film 312, and the third inorganic insulating film 900 may be disposed only around the first connection line 216 and the second connection line 218 as in the variation of the first embodiment.

As shown in FIG. 10B, the cross-sectional configuration at the position where the first connection line 216 and the second connection line 218 are planarly shifted from each other is the same as the cross-sectional configuration shown in FIG. 10A except that the first layer wiring and the second layer wiring are planarly shifted from each other. In the variation above, as shown in FIG. 10E, the third inorganic insulating film 900 is disposed so as to cover the first inorganic insulating film 308. The second layer wiring is disposed on the third inorganic insulating film 900. The organic flattening film 312 is disposed so as to cover the second layer wiring, the first inorganic insulating film 308, and the second inorganic insulating film 314.

As shown in FIG. 10C, at the position where the first layer wiring and the second layer wiring are electrically connected to each other, the inorganic film 210 and the first layer wiring are separated and disposed at two positions. The first inorganic insulating film 308 has a contact hole at the top of the first layer wiring, and is disposed so as to cover other areas. The third layer wiring 800 is disposed so as to connect to the first layer wiring through the contact hole. Although not shown in FIG. 3, the third layer wiring 800 may be formed of the same material as that of the first layer wiring or the second layer wiring.

The third inorganic insulating film 900 has a contact hole at the top of the third layer wiring 800, and is disposed so as to cover other areas. The second layer wiring is disposed so as to connect to the third layer wiring 800 through the contact hole. The organic flattening film 312 is disposed so as to cover the second layer wiring and the third inorganic insulating film 900. In the above variation, as shown in FIG. 10F, the first inorganic insulating film 308 and the organic flattening film 312 may be disposed only around the first connection line 216, the second connection line 218, and the third layer wiring 800.

In the second embodiment, the third layer wiring 800 may not be newly provided. Specifically, the second layer wiring may be disposed instead of the third layer wiring 800, and the lower electrode 320 may be disposed instead of the second layer wiring.

The third inorganic insulating film 900 may be omitted. Specifically, the cross-sectional configuration of the bending area 214 may be the cross-sectional configuration shown in FIGS. 11A to 11F. FIGS. 11A to 11F are cross sections of the variation of the second embodiment where the third inorganic insulating film 900 is omitted, and respectively correspond to FIGS. 10A to 10F.

Third Embodiment

Next, the third embodiment will be described. In the third embodiment, the bending area 214 is further provided with third connection lines 1100 that electrically connect the pixel array part to the connection terminal part 226. In the third embodiment, the matters that are not particularly described are the same as those in the first embodiment, and thus the detailed description will be omitted.

Figure 12:
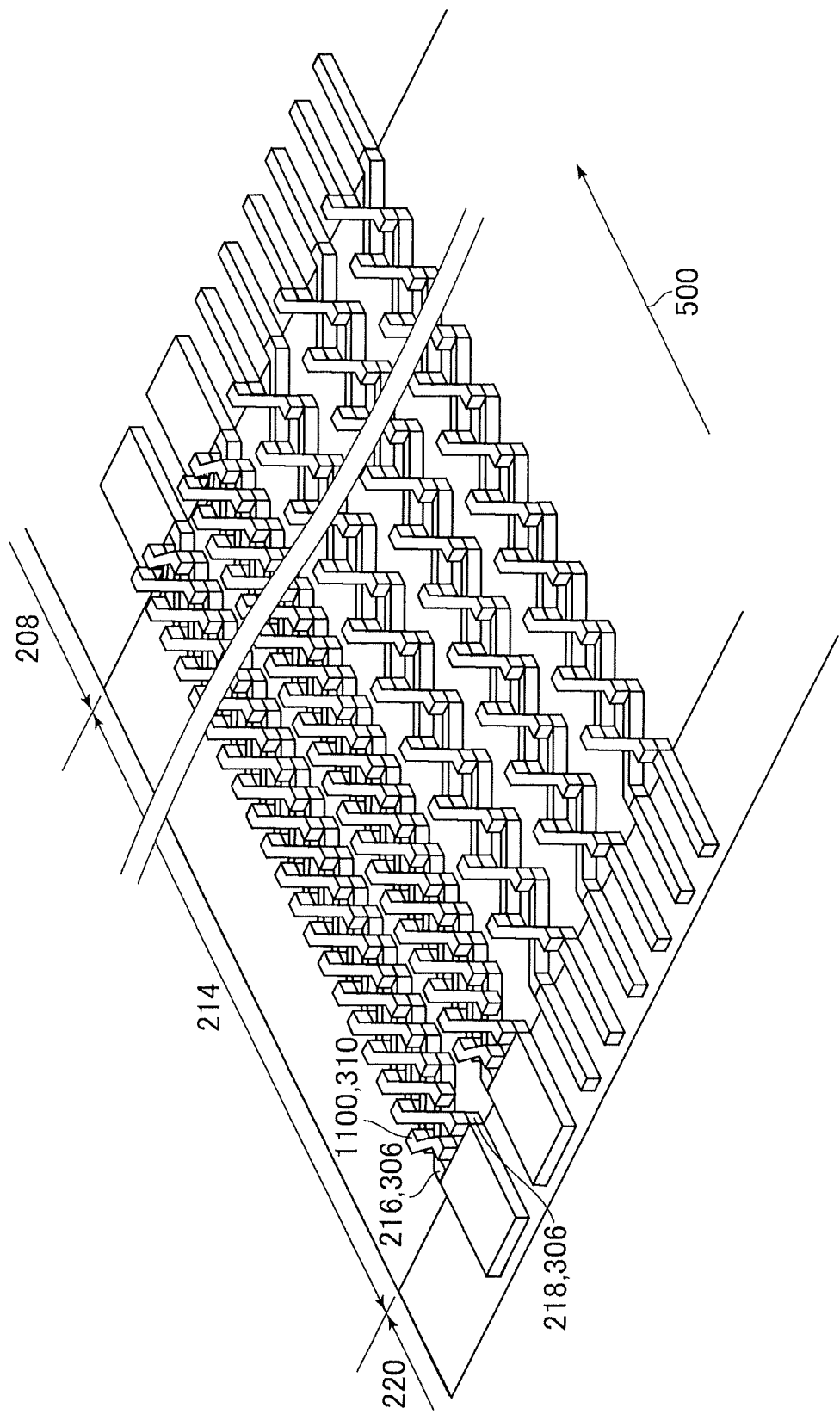
FIG. 12 is a perspective view of first to third connection lines in the third embodiment.
Figure 13:
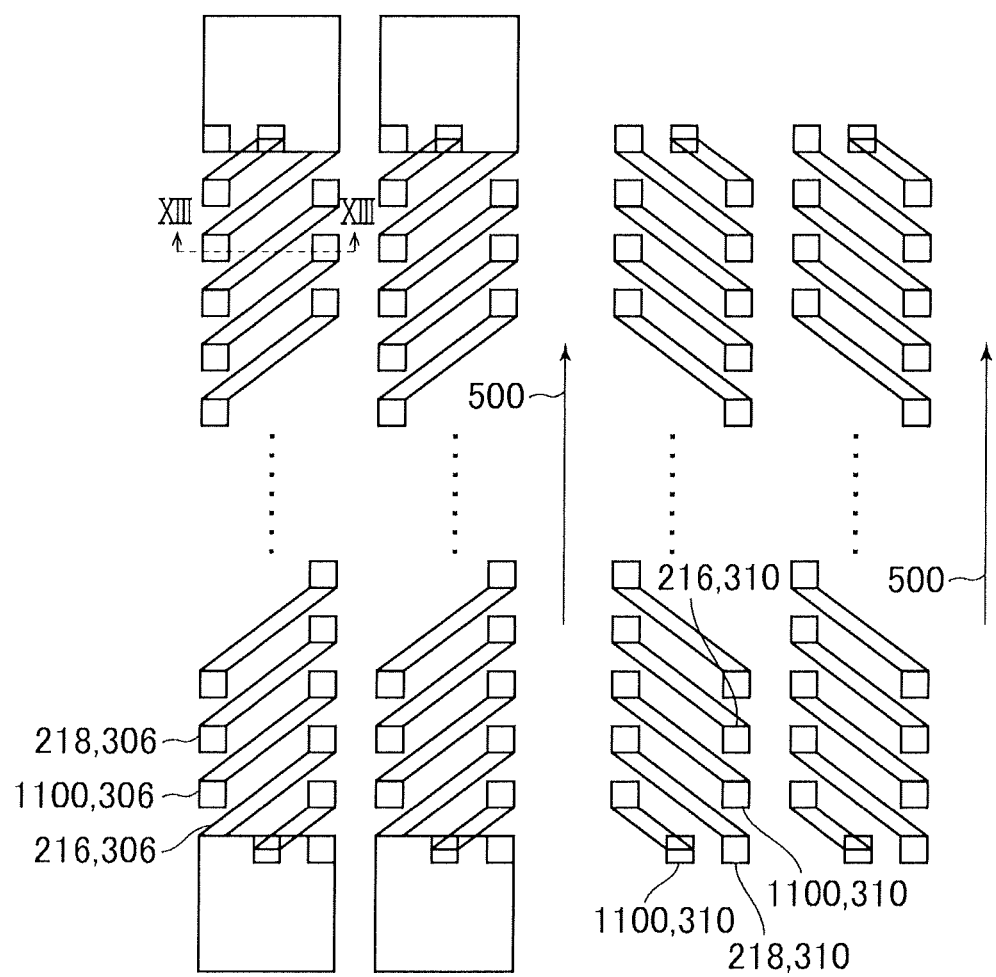
FIGS. 13A and 13B are plan views of first to third connection lines in the third embodiment.

FIG. 12 is a perspective view of the first to third connection lines 216, 218, and 1100 in the third embodiment. FIG. 13A is a diagram illustrating the first layer wiring of two pairs of first to third connection lines 216, 218, and 1100 disposed in the left of FIG. 12 in a plan view. FIG. 13B is a diagram illustrating the second layer wiring of two pairs of first to third connection lines 216, 218, and 1100 disposed in the left of FIG. 12 in a plan view.

The third connection lines 1100 have first layer wiring and second layer wiring. Specifically, the third connection lines 1100 include the first layer wiring disposed on the first wiring layer 306 and the second layer wiring disposed on the second wiring layer 310 similarly to the first connection lines 216 and the second connection lines 218.

The first layer wiring of the third connection lines 1100 is disposed between the first layer wiring of the first connection lines 216 and the first layer wiring of the second connection lines 218 so as to intersect the second layer wiring of the first connection lines 216 and the second layer wiring of the second connection line 218.

Specifically, as shown in FIG. 12, the first layer wiring of the third connection lines 1100 is disposed between the first connection lines 216 and the second connection lines 218 in the bending area 214. As shown in FIG. 13A, the first layer wiring of the third connection lines 1100 is disposed obliquely and rightward to the extending direction 500 in an area closest to the connection area 220 in the bending area 214.

In the area closest to the connection area 220 in the bending area 214, the first layer wiring of the first connection lines 216 is also disposed. The first layer wiring of the third connection lines 1100, the first layer wiring of the second connection lines 218, the first layer wiring of the third connection lines 1100, and the first layer wiring of the first connection lines 216 are repeatedly disposed in this order from the first layer wiring of the first connection lines 216 to the extending direction 500.

The second layer wiring of the third connection lines 1100 is disposed between the second layer wiring of the first connection lines 216 and the second layer wiring of the second connection lines 218 so as to intersect the first layer wiring of the first connection lines 216 and the first layer wiring of the second connection lines 218.

Specifically, as shown in FIG. 12, the second layer wiring of the third connection lines 1100 is disposed between the first connection lines 216 and the second connection lines 218 in the bending area 214. As shown in FIG. 13B, the second layer wiring of the third connection lines 1100 is disposed obliquely and leftward to the extending direction 500 in an area closest to the connection area 220 in the bending area 214.

The second layer wiring of the second connection lines 218 is also disposed in the area closest to the connection area 220 in the bending area 214. The second layer wiring of the third connection lines 1100, the second layer wiring of the first connection lines 216, the second layer wiring of the third connection lines 1100, and the second layer wiring of the second connection lines 218 are repeatedly disposed in this order from the second layer wiring of the second connection lines 218 to the extending direction 500.

Figure 14:
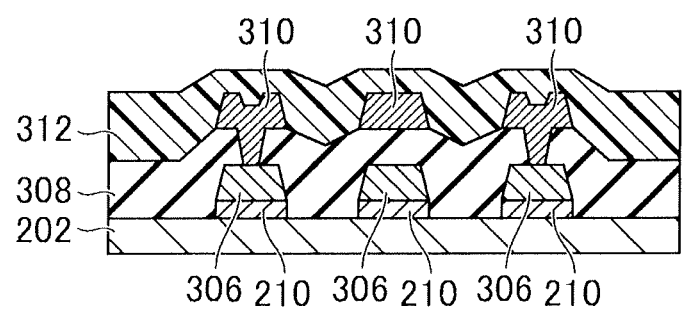
FIG. 14 is a cross-sectional view of first to third connection lines in the third embodiment.

FIG. 14 is a XIII-XIII cross section of FIG. 13A at the position where the first connection lines 216 and the second connection lines 218 are planarly overlapped with each other. As shown in FIG. 14, the inorganic film 210 is divided into three parts and disposed on the insulating substrate 202. The first layer wiring of the first connection lines 216, the first layer wiring of the third connection lines 1100, and the first layer wiring of the second connection lines 218 are disposed on the inorganic film 210 in this order from the left. This order varies depending on a location of the cross section.

The first inorganic insulating film 308 has a contact hole at the top of the first layer wiring of the first connection lines 216 and the first layer wiring of the second connection lines 218, and is disposed so as to cover other areas. The second layer wiring is disposed so as to connect to the first layer wiring of the first connection lines 216 and the first layer wiring of the second connection lines 218 through the contact hole. The second layer wiring is also disposed on the area where the first layer wiring of the third connection lines 1100 is disposed.

The organic flattening film 312 is disposed so as to cover the first inorganic insulating film 308 and the second layer wiring. Similarly to the variations of the first and second embodiments, the first inorganic insulating film 308 and the organic flattening film 312 may be disposed only around the first to third connection lines 216, 218, and 1100.

With the above configuration, the first layer wiring of the third connection lines 1100 is disposed so as to intersect the second layer wiring of the first connection lines 216 and the second layer wiring of the second connection lines 218. Further, the second layer wiring of the third connection lines 1100 is disposed so as to intersect the first layer wiring of the first connection lines 216 and the first layer wiring of the second connection lines 218.

In this embodiment, preferably, power is supplied to the first to third connection lines 216, 218, and 1100 that are connected to one another in the pixel array part and the connection terminal part 226. Specifically, as described above, the first to third connection lines 216, 218, and 1100 are electrically connected to one another in the frame area 212 around the display area 208 and in the connection area 220. As such, the electrical resistance of the first to third connection lines 216, 218, and 1100 can be further reduced and larger current can flow to the first to third connection lines 216, 218, and 1100 than in the first and second embodiments.

Fourth Embodiment

Next, the fourth embodiment will be described. In the fourth embodiment, the matters that are not particularly described are similar to those in the third embodiment, and thus the detailed description will be omitted.

The perspective view of the first to third connection lines 216, 218, and 1100 in the fourth embodiment is the same as that in the third embodiment as shown in FIG. 12. FIG. 15A is a plan view of the first layer wiring in the fourth embodiment. FIG. 15B is a plan view of the third layer wiring 800. FIG. 15C is a plan view of the second layer wiring. The first layer wiring shown in FIG. 15A and the second layer wiring shown in FIG. 15C are the same as those in the third embodiment.

As shown in FIG. 15B, in the area where the first layer wiring and the second layer wiring of the first connection lines 216 overlap with each other, the first connection lines 216 include the third layer wiring 800 between the first layer and the second layer so as to electrically connect the first layer wiring with the second layer wiring. Similarly, the second connection lines 218 and the third connection lines 1100 include the third layer wiring 800 between the first layer and the second layer so as to electrically connect the first layer wiring with the second layer wiring.

Figure 16A:
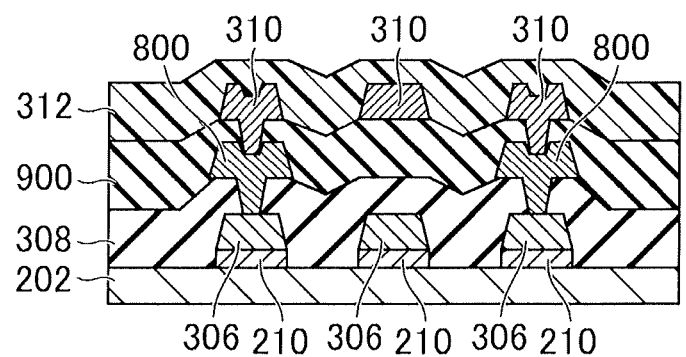
FIGS. 16A and 16B are cross-sectional views of first to third connection lines in the fourth embodiment.
Figure 16B:
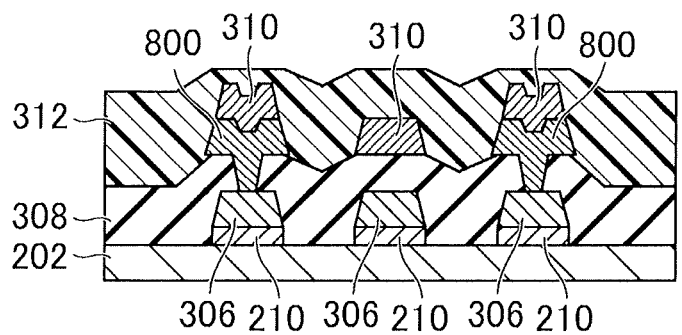

FIGS. 16A and 16B are XV-XV cross sections of FIG. 15A at the position where the first connection lines 216 and the second connection lines 218 planarly overlap one another.

As shown in FIG. 16A, the inorganic film 210 and the first layer wiring are separated and disposed at three positions. The first layer wiring includes, from left to right, the first connection lines 216, the third connection lines 1100, and the second connection lines 218 as in the third embodiment. The first inorganic insulating film 308 includes a contact hole at the top of the first layer wiring of the first connection lines 216 and the second connection lines 218, and is disposed so as to cover other areas.

The third layer wiring 800 is disposed so as to connect to the first layer wiring of the first connection lines 216 and the second connection lines 218 through the contact hole. The third inorganic insulating film 900 includes a contact hole at the top of the third layer wiring 800 of the first connection lines 216 and the second connection lines 218, and is disposed so as to cover other areas.

The second layer wiring is disposed so as to connect to the third layer wiring 800 of the first connection lines 216 and the second connection lines 218 through the contact hole. The second layer wiring is also disposed on an area where the first layer wiring of the third connection lines 1100 is disposed. The organic flattening film 312 is disposed so as to cover the second layer wiring and the third inorganic insulating film 900.

Similarly to the variations of the first and second embodiments, the first inorganic insulating film 308 and the second inorganic insulating film 314 may be disposed only around the first to third connection lines 216, 218, and 1100. As FIG. 16B suggests, the third inorganic insulating film 900 may be omitted.

Fifth Embodiment

Next, the fifth embodiment will be described. In the fifth embodiment, the matters that are not particularly described are similar to those in the third embodiment, and thus the detailed description will be omitted.

Figure 17:
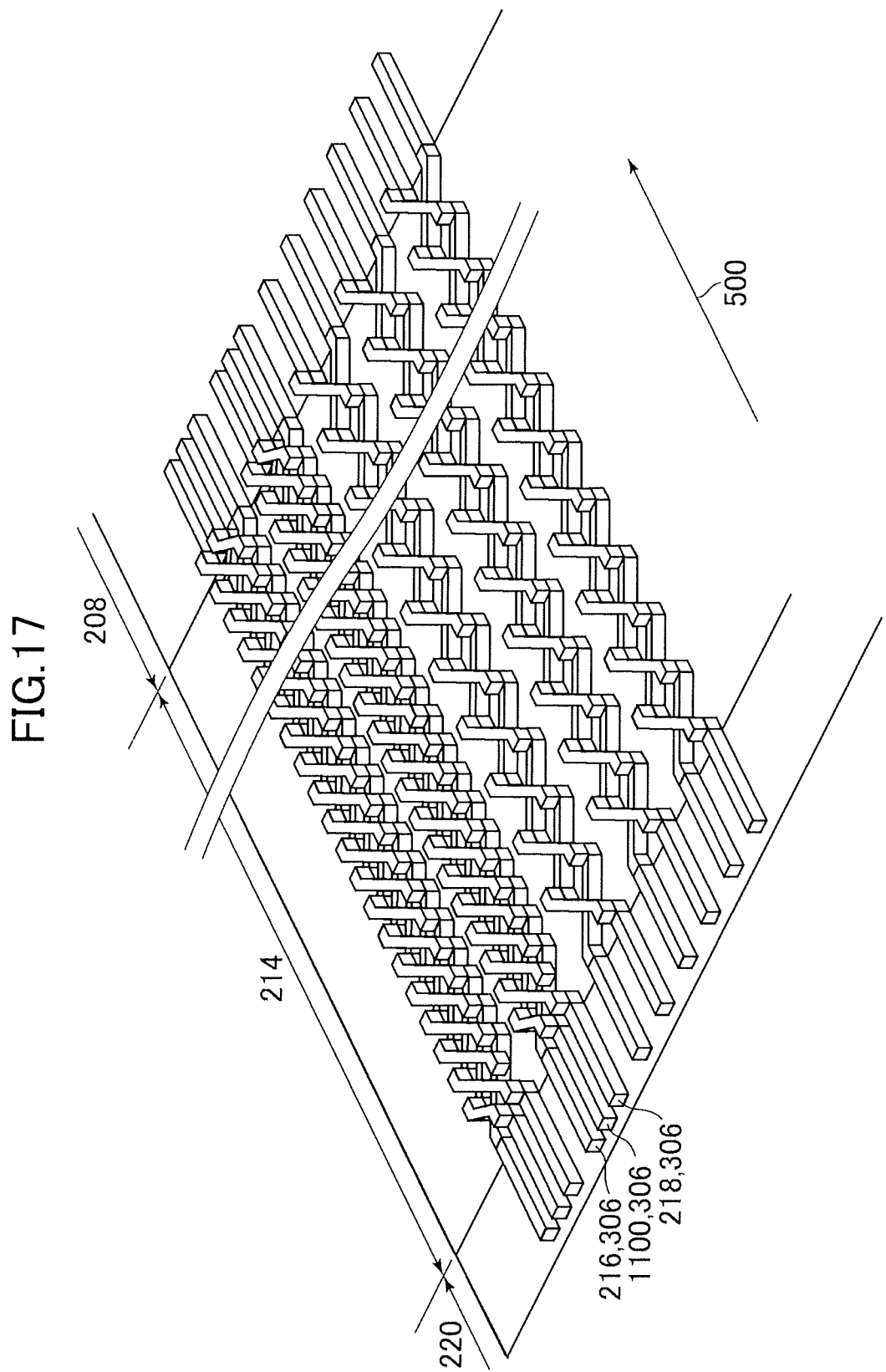
FIG. 17 is a perspective view of first to third connection lines in the fifth embodiment.
Figure 18:
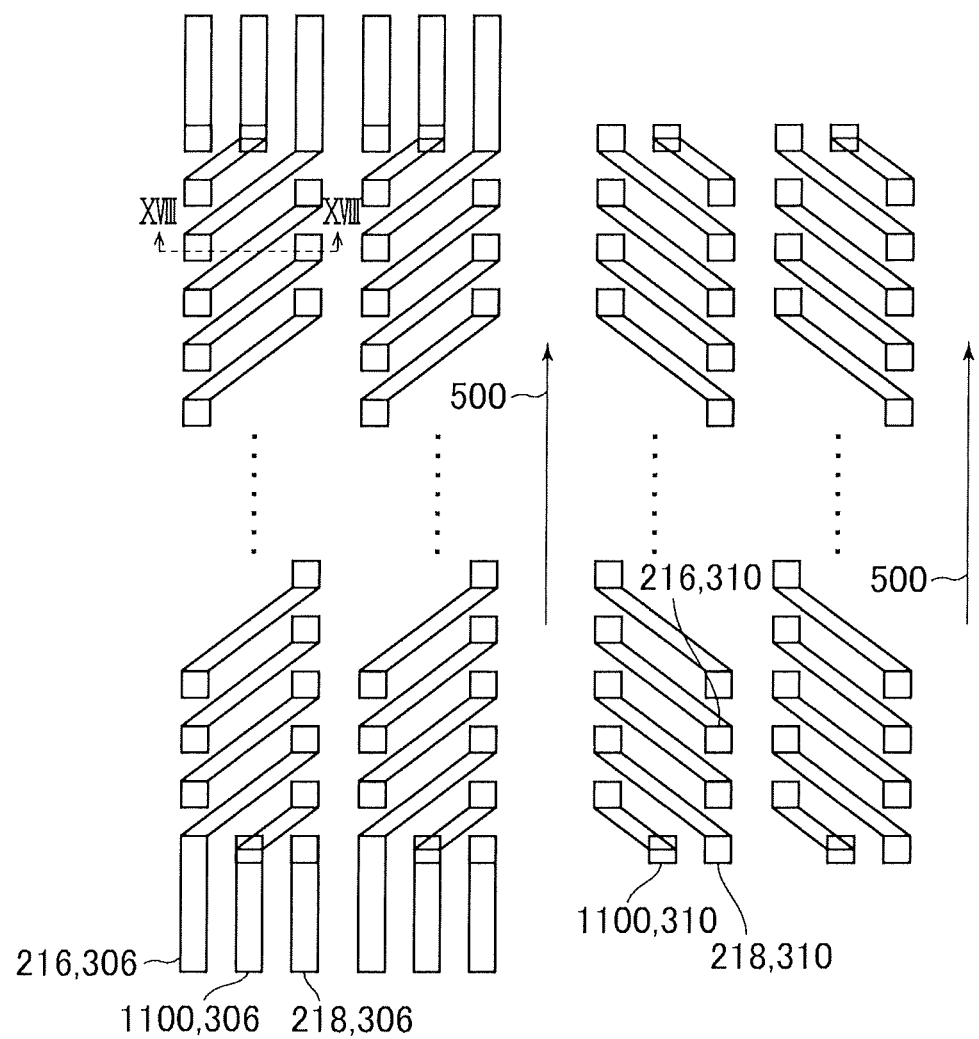
FIGS. 18A and 18B are plan views of first to third connection lines in the fifth embodiment.
Figure 19:
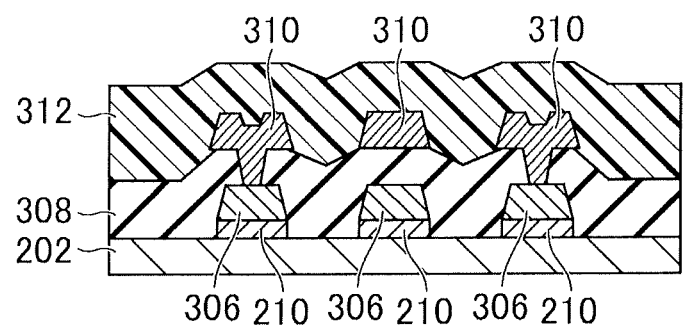
FIG. 19 is a cross-sectional view of first to third connection lines in the fifth embodiment.

FIG. 17 is a perspective view of the first to third connection lines 216, 218, and 1100 in the fifth embodiment. FIG. 18A is a plan view of two pairs of the first to third connection lines 216, 218, and 1100 of the first layer wiring disposed on the left side of FIG. 17. FIG. 18B is a plan view of three pairs of first to third connection lines 216, 218, and 1100 of the second layer wiring disposed in the right side of FIG. 12. FIG. 19 is a XVIII-XVIII cross section of FIG. 18A.

As shown in FIGS. 17, 18A, and 18B, the first to third connection lines 216, 218, and 1100 disposed in the bending area 214 are the same as those in the third embodiment, and thus detailed description thereof will be omitted. FIG. 19 is a XVIII-XVIII cross section of FIG. 18A, which is the same as that in the third embodiment and will be omitted in the following description.

As shown in FIGS. 17, 18A, and 18B, the first to third connection lines 216, 218, and 1100 are separated from one another in the pixel array part included in the display area 208 and in the connection area 220. As such, the combined first to third connection lines 216, 218, and 1100 are electrically insulated.

In this embodiment, preferably, differential pair signals are supplied to the first connection lines 216 and the second connection lines 218, and GND voltage is supplied to the third connection lines 1100. The GND voltage is supplied to the third connection lines 1100 that are combined with the first connection lines 216 and the second connection lines 218, and thus radiation noise can be further reduced compared to the first embodiment.

In the embodiments above, the inorganic film 210 is disposed under the first layer wiring of the bending area 214, although the inorganic film 210 may be omitted. Further, the second inorganic insulating film 314 may be disposed instead of the organic flattening film 312.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a display area including a pixel array part including at least one terminal;
    a connection area disposed on a back side of the display area and including a connection terminal part to which a signal is supplied from outside; and
    a bending area connecting the display area with the connection area and including a first connection line and a second connection line that are disposed between the pixel array part and the connection terminal part, wherein
    the pixel array part includes a transistor including a semiconductor layer, a first layer on the semiconductor layer, a gate electrode on the first layer, a second layer on the gate electrode, a source electrode on the second layer, and a drain electrode on the second layer,
    the first connection line includes a first wiring on the first layer and a second wiring on the second layer, the first wiring being disposed obliquely and leftward to an extending direction of the first connection line and the second connection line, the second wiring being disposed obliquely and rightward to the extending direction and connected to the first wiring,
    the second connection line includes a third wiring on the first layer and a fourth wiring on the second layer, the third wiring being disposed obliquely and leftward to the extending direction of the first connection line and the second connection line, the fourth wiring being disposed obliquely and rightward to the extending direction and connected to the third wiring,
    the first wiring and the third wiring are formed of a same layer as the gate electrode,
    the second wiring and the fourth wiring are formed of a same layer as the source electrode,
    the first wiring of the first connection line and the fourth wiring of the second connection line are disposed so as to intersect with each other,
    in plan view, the first wiring of the first connection line and the fourth wiring of the second connection line are overlapped each other, and
    the first wiring of the first connection line and the fourth wiring of the second connection line are separated from each other so that a predetermined insulation layer is disposed between the first wiring of the first connection line and the fourth wiring of the second connection line.

2. The display device according to claim 1, further comprising a third connection line on the bending area, the third connection line disposed between the pixel array part and the connection terminal part, wherein
    the third connection line includes a fifth wiring and a sixth wiring,
    the fifth wiring of the third connection line is disposed between the first wiring of the first connection line and the third wiring of the second connection line, and intersects with the second wiring of the first connection line and the fourth wiring of the second connection line,
    the sixth wiring of the third connection line is disposed between the second wiring of the first connection line and the fourth wiring of the second connection line, and intersects with the first wiring of the first connection line and the third wiring of the second connection line,
    the fifth wiring and the third wiring are formed of a same layer as the gate electrode,
    the sixth wiring and the fourth wiring are formed of a same layer as the source electrode,
    in plan view, the fifth wiring of the third connection line overlaps with the fourth wiring of the second connection line and the second wiring of the first connection line,
    in plan view, the sixth wiring of the third connection line overlaps with the third wiring of the second connection line and the first wiring of the first connection line,
    the fifth wiring and the fourth wiring are separated from each other so that the predetermined insulation layer is disposed between the fifth wiring and the fourth wiring,
    the fifth wiring and the second wiring are separated from each other so that the predetermined insulation layer is disposed between the fifth wiring and the second wiring,
    the sixth wiring and the third wiring are separated from each other so that the predetermined insulation layer is disposed between the sixth wiring and the third wiring, and
    the sixth wiring and the first wiring are separated from each other so that the predetermined insulation layer is disposed between the sixth wiring and the first wiring.

3. The display device according to claim 1, wherein
the first connection line and the second connection line
are electrically connected to each other in a frame area
disposed around the display area and in the connection
area.

4. The display device according to claim 2, wherein
the first to third connection lines are electrically connected to one another in a frame area disposed around
the display area and in the connection area.

5. The display device according to claim 1, wherein
the first connection line receives one side of a differential
signal, and the second connection line receives the
other side of the differential signal.

6. The display device according to claim 2, wherein
GND voltage is supplied to the third connection line.

7. The display device according to claim 1, wherein
the first connection line includes a first connection wiring
between the first layer and the second layer in an area
where the first wiring overlaps with the second wiring,
the first connection wiring electrically connecting the
first wiring with the second wiring, and
the second connection line includes a second connection
wiring between the first layer and the second layer in an
area where the third wiring overlaps with the fourth
wiring, the second connection wiring electrically connecting the third wiring with the fourth wiring.

* * * * *